(12) United States Patent
Sachs et al.

(10) Patent No.: US 8,669,187 B2
(45) Date of Patent: Mar. 11, 2014

(54) POROUS LIFT-OFF LAYER FOR SELECTIVE REMOVAL OF DEPOSITED FILMS

(75) Inventors: Emanuel M. Sachs, Newton, MA (US); Andrew M. Gabor, Providence, RI (US)

(73) Assignee: 1366 Technologies, Inc., Bedford, MA (US)

( * ) Notice: Subject to any disclaimer, the term of this patent is extended or adjusted under 35 U.S.C. 154(b) by 141 days.

(21) Appl. No.: 13/318,971

(22) PCT Filed: May 7, 2010

(86) PCT No.: PCT/US2010/034067
§ 371 (c)(1),
(2), (4) Date: Jan. 31, 2012

(87) PCT Pub. No.: WO2010/129884
PCT Pub. Date: Nov. 11, 2010

(65) Prior Publication Data
US 2012/0122266 A1 May 17, 2012

Related U.S. Application Data

(60) Provisional application No. 61/215,671, filed on May 8, 2009.

(51) Int. Cl.
*H01L 21/302* (2006.01)
*H01L 21/461* (2006.01)

(52) U.S. Cl.
USPC .... 438/706; 438/106; 438/409; 257/E21.006; 257/E21.007; 257/E21.135; 257/E21.151; 257/E21.229; 257/E21.245; 257/E21.288; 257/E21.499

(58) Field of Classification Search
USPC ........... 438/706, 409, 106, 48, 55, 64, 8, 700, 438/753; 257/E21.006, E21.007, E21.135, 257/E21.151, E21.229, E21.245
See application file for complete search history.

(56) References Cited

U.S. PATENT DOCUMENTS

| | | | | |
|---|---|---|---|---|
| 5,286,306 A | * | 2/1994 | Menezes | 136/249 |
| 5,529,950 A | * | 6/1996 | Hoenlein et al. | 438/107 |
| 5,997,713 A | * | 12/1999 | Beetz et al. | 205/124 |
| 6,118,204 A | * | 9/2000 | Brown | 310/303 |
| 6,204,087 B1 | * | 3/2001 | Parker et al. | 438/56 |
| 6,774,531 B1 | * | 8/2004 | Gadeken | 310/303 |
| 7,250,323 B2 | * | 7/2007 | Gadeken et al. | 438/56 |

* cited by examiner

*Primary Examiner* — David Nhu
(74) *Attorney, Agent, or Firm* — Steven J. Weissburg

(57) ABSTRACT

A porous lift off layer facilitates removal of films from surfaces, such as semiconductors. A layer, with porosities typically larger than the film thickness is provided where no film is desired. The film is applied over the porous layer and also where it is desired. The porous material and the film are then removed from areas where film is not intended. The porous layer can be provided as a slurry, dried to open porosities, or fugitive particles within a field, which disassociate upon the application of heat or solvent. The film can be removed by etchant that enters through porosities that have arisen due to the film not bridging the spaces between solid portions. Etchant attacks both film surfaces. Particles may have diameters of four to ten times the film thickness. Particles may be silica, alumina and ceramics. Porous layers can be used in depressions or on flat surfaces.

35 Claims, 13 Drawing Sheets

_POROUS LIFT-OFF LAYER FOR SELECTIVE REMOVAL OF DEPOSITED FILMS_

RELATED DOCUMENTS

Priority is hereby claimed to U.S. Provisional application Ser. No. 61/215,671, entitled POROUS LIFT-OFF LAYER FOR SELECTIVE REMOVAL OF DEPOSITED FILMS, in the names of Emanuel M. Sachs and Andrew M. Gabor, filed on May 8, 2009, which is hereby incorporated herein fully by reference. This Application is a 35 U.S.C. §371 National Phase of International Application No. PCT/US2010/34067 filed on May 7, 2010.

Certain processing schemes and architecture are disclosed in Patent Cooperation Treaty Application No. PCT/US2008/002058, entitled SOLAR CELL WITH TEXTURED SURFACES, filed Feb. 15, 2008, in the names of Emanuel M. Sachs and James F. Bredt and the Massachusetts Institute of Technology, designating the United States of America, and also claiming priority to two provisional United States applications, U.S. No. 60/901,511, filed Feb. 15, 2007, and U.S. No. 61/011,933, filed Jan. 23, 2007. All of the PCT application and the two US provisional applications are hereby incorporated fully herein by reference. The technology disclosed in these applications is referred to herein collectively as Self Aligned Cell (SAC) technology.

Co-assigned PCT application PCT/US2009/02422, filed on Apr. 17, 2009, in the names of Andrew M. Gabor, Richard L. Wallace and 1366 Technologies Inc., entitled METHOD TO PATTERN DIFFUSION LAYERS IN SOLAR CELLS AND SOLAR CELLS MADE BY SUCH METHODS, discloses certain structures discussed below, and the full disclosure of PCT/US2009/02422 is hereby incorporated fully herein by reference.

Certain processing schemes for providing liquid containing material to a surface are discussed in PCT application PCT/US2010/020245, filed on Jan. 6, 2010, in the names of Emanuel M. Sachs, Richard L. Wallace, James F. Bredt, Benjamin F. Polito, Ali Ersen and 1366 Technologies Inc., entitled DISPENSING LIQUID CONTAINING MATERIAL TO PATTERNED SURFACES USING A DISPENSING TUBE, designating the Unites States of America, and claiming priority to U. S. Provisional Application 61/204,382 entitled, DISPENSING LIQUID CONTAINING MATERIAL TO PATTERNED SURFACES USING A CAPILLARY DISPENSING TUBE, filed on Jan. 6, 2009. Both the PCT and the provisional applications are hereby incorporated fully herein by reference.

INTRODUCTION

In solar cell fabrication, there are several instances where it is desirable to have a dielectric film with openings in it. For example, in the fabrication of solar cells on wafers of crystalline silicon, a dielectric, such as silicon nitride, is used on the front (sun-facing side) of the cell as an antireflection coating and a passivating surface. A metallization is then deposited on the cell. The metallization must contact the silicon itself. Thus, there needs to be openings in the film, so that the metal can contact the silicon. A common procedure is to use silver pastes, which have chemical frits in them that react with the dielectric to etch a hole in the dielectric, through which the metal may make contact. However, some approaches to metallization cannot have such a reactive component and therefore the dielectric must be opened before the metallization.

Another example, also in the area of crystalline silicon photovoltaics, is on the back of a cell, facing away from the sun. High performance back contacts are often based on a structure where a dielectric film is deposited, and then a layer of metal is deposited. Similarly, the metal must make contact through the dielectric film to the silicon, but only over a small percentage of the total area. For example, one technique used is known as a Laser Fired Contact (LFC) technique. An oxide film is grown on the back of the wafer, aluminum is evaporated, and then a laser is used to rapidly and locally heat many hundreds of points, to liquefy the aluminum, react through the oxide, and make contact to the silicon below. Typically, for example, the individual contacts are approximately 50 microns in size and are spaced approximately 500 microns apart. An alternative method to create a high performance back structure is to deposit the dielectric film and then to use laser ablation to open holes in the film. A metal layer is deposited and it makes contact through the laser-opened holes.

SUMMARY

For semiconductor wafer processing methods disclosed herein, a novel porous lift off layer is used to facilitate removal of certain other applied materials, such as antireflection film coatings. A porous layer, composed of particles and porosities that are preferably, but not necessarily larger than the thickness of the applied film layer is provided in a region where no coating is desired. After the coating film has been applied over the porous layer and also other parts of the semiconductor where it is desired, the porous material is removed, which also results in removal of the overlying film from areas where it is not desired. The porous layer can be provided as a slurry, which is later dried to open up porosities, or a layer having fugitive particles within a field of some material, such as a heat degradable or liquid soluble particles, which disassociates from the field upon the application of heat or solvent. The coating film layer can be removed by etching, by providing an etchant, which enters the coating film through porosities that have arisen due to the coating not bridging the spaces between particles. The etchant flows throughout the porous layer, attacking the coating from both surfaces of the coating film. Particles may have diameters of, for instance, four to ten times the film thickness, which results in pores being slightly smaller than the particles. Particles may be silica, alumina and other ceramics. Such porous layers can be used in depressions into which metallization is to be provided, to protect the depression from antireflective coating.

BRIEF DESCRIPTION OF THE DRAWINGS

FIG. 1aA shows a schematic cross-sectional view of the semiconductor surface of FIG. 1, along lines A-A.

FIG. 1bA shows a schematic cross-sectional view of the semiconductor surface of FIG. 1b, along lines A-A;

FIG. 1cA shows a schematic cross-sectional view of the semiconductor surface of FIG. 1c, along lines A-A;

FIG. 1dA shows a schematic cross-sectional view of the semiconductor surface of FIG. 1d, along lines A-A;

FIG. 1eA shows a schematic cross-sectional view of the semiconductor surface of FIG. 1e, along lines A-A;

DETAILED DESCRIPTION

Figure 1A:
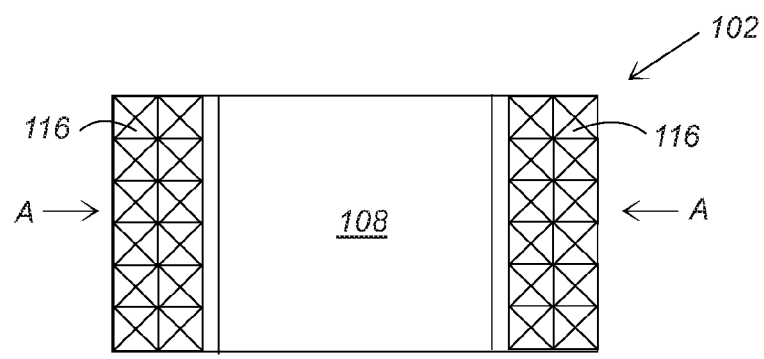
FIG. 1a shows a schematic plan view of a semiconductor surface that will be treated according to methods disclosed herein, with an empty groove.
Figure 1A:
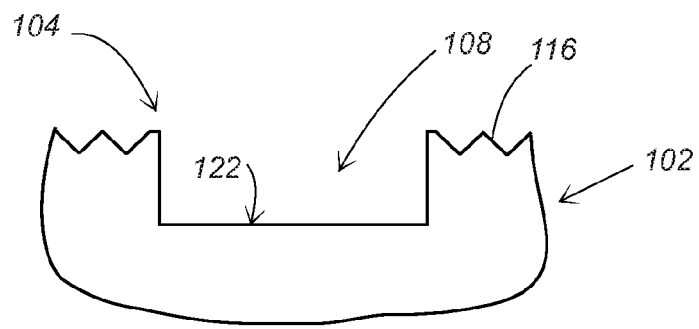

With an innovation disclosed herein, a porous lift-off material is deposited on a silicon surface before deposition of a dielectric film. The film is then deposited everywhere, including on top of the lift-off material. After a processing step, such as an ultrasonic wash and/or light chemical etching, the lift-off material comes off, removing the overlying dielectric film with it, thereby leaving openings to the silicon.

Typically, such dielectric films are high quality, with very low defect and pinhole density. Thus, undercutting such a dielectric film to create larger openings in it, such as for metallization, presents a challenge. One problem is that the integrity of the film itself presents a barrier to chemical ingress to accomplish the undercutting.

One aspect of an innovation disclosed herein is to deposit a highly porous lift-off layer (referred to concisely, herein as a PLOL), which can tolerate the temperatures and chemical environments associated with dielectric deposition. The porosity of the lift-off layer provides at least three functions. One is that porosity creates openings and other defects in the film deposited upon it, so that etching chemistry can enter through these defects and attack the lift-off layer. The porosity also allows for lateral communication of etching chemistry within the porous lift-off layer itself, thereby allowing for film degradation and lift-off over its entire surface, even if only a few openings or defects in the film are present. By lateral, it is meant substantially parallel to the surface to which the porous material and the film is being provided. Third, a porous layer, properly composed, will have substantially no line of sight from the external coating environment to the surface of the wafer beneath it, thereby directly blocking deposition of the coating film on the surface.

Referring now to FIGS. 1a-1e, in one embodiment of an innovation disclosed herein, the PLOL begins as a slurry of fine ceramic particles in a liquid vehicle. A semiconductor body 102 is provided, with a surface 104 upon which it is desired to process. The slurry (not shown) is deposited generally where the designer intends that there be a PLOL, such as in a groove 108. After drying the liquid vehicle, the solid particles 110 of the slurry remain on the surface 104 of the wafer. Preferably, there are multiple layers 112a, 112b, 112c, etc. of particles 110 left behind. The number of layers can vary between two and tens, although three to four layers are sufficient in most cases. The film 114 can be next deposited on top of the dried layers 112a-112c of powder and directly on the wafer in regions 116 where no lift-off layer was provided.

In many applications it is advantageous if the size of the pores (parallel to the plane of the substrate) is larger than the thickness of the film 114 so that the pores are not closed after the film is deposited. Preferably, the size of the pores should be at least 2-5 times the thickness of the film. In cases where the PLOL is composed of powder, the size of the powder particles 110 should be at least 4-10 times the thickness of the film 114, as the pores in a powder layer are typically smaller than the powder particles themselves. The upper limit on the size of the powder particles 110 used depends primarily on aspects of topography. For example, when the PLOL is used to fill a trench, typically, the powder particles should be no larger than approximately ⅓ the depth of the trench so that when the trench is filled, there are at least 3 layers of particles in the PLOL. In a case where a PLOL is deposited on a flat surface, the PLOL should not be so high as to impact the deposition of the film outside the PLOL, for example by shading.

EXAMPLE

For a PLOL in a trench, the trench may be 30 microns wide and 10 microns deep. If the PLOL is made of powder 1-2 microns in diameter, film of thickness 0.4 microns and less can be used. For a PLOL on a relatively flat surface, if the PLOL is composed of particles 5-10 microns in diameter, the film thickness may be 1 micron or less.

The porous lift-off layer provides several conditions that facilitate the removal of films deposited upon it. The presence of the porous material prevents the film from being deposited on the surface that the porous material protects. The porous nature of the lift-off layer causes the deposited film to be discontinuous because the film deposits as segments interrupted by the pores. This makes the film easier to remove, as it can come off in small pieces. Etchant or another removal agent can enter through openings in the film created by the porosity of the lift-off layer. The film, or segments of the film can then be attacked from both top and bottom. When the porous lift-off layer is made of powder, the deposited film may bridge powder particles causing some binding between them. However, these bridges are small and fragile and may be broken with ultrasonic agitation, for example. The mass of the powder particles themselves can aid such breakup as the ultrasonic energy can couple into the particles and cause particles to move relative to each other, thereby breaking the film at the necks. In some cases, the necks will be out of the line of sight during the deposition of the film and no material will even deposit on these necks.

By the mechanisms summarized above, the porous lift-off layer allows for lift-off of films which themselves have no porosity at all. That is, successful lift-off does not depend on porosity in the deposited film, but rather takes advantage of the larger scale openings created by deposition of the film on the porous lift-off layer.

Thus, techniques disclosed herein are particularly useful for films that have no intrinsic porosity. The techniques disclosed herein are also useful for films that do have porosity, because they form openings at the locations where the PLOL has been deposited, even more readily. Whether or not a deposited film has pores or is pore-free, depends on both the deposition technique and the deposition parameters. In general, films deposited by thermal chemical vapor deposition will tend to be pore-free. Films deposited by plasma enhanced chemical vapor deposition (PECVD) can be either pore-free or can have pores, depending on deposition parameters. Films deposited by evaporation will tend more toward having pores.

The pore size need not be larger than the film thickness for all applications. For instance, with films that have porosity, as just discussed, use of particles that give rise to a pore size that is smaller than the film thickness still may provide a useful lift-off function. In such a case, the pores admit some etching chemistry, which can initiate degrading the film. In addition, the film may be fragile, due to the presence of the particles, albeit fine particles. Further, the mechanical agitation or other energy applied to the particles may be enough to dislodge the film, even if it is formed without any pores or other openings to admit etching chemistry. Thus, the inventions disclosed herein are not limited to methods in which the pores have sizes that are larger than the film thickness. Although, that is a very important embodiment of inventions disclosed herein.

EXAMPLE

FIGS. 1a, 1b, 1c, 1d and 1e, and their respective cross-sections FIGS. 1aA, 1bA, 1cA, 1dA and 1eA show a method disclosed herein applied to blocking the deposition of a silicon nitride antireflection coating 114 (FIGS. 1c and 1cA) on the front 104 of a silicon solar cell 102. In this case, a slurry (not shown) of 1-2 micron diameter spherical silica powder particles 110 can be prepared in water with Polyethylenimine (PEI) as a dispersant. A typical slurry composition is approximately 1:1 water:silica by weight with 0.03 parts by weight of PEI as a dispersant. Many other polymeric dispersants are known in the art for dispersing silica, such as an ammonium salt of a polyelectrolyte, for example, as sold under the tradename Duramax 3005, from Rohm and Haas, of Philadelphia, Pa. Silica can also be dispersed electrostatically—by controlling the pH of the slurry. (Rather than silica, the powder in the slurry could be, alumina, silicon carbide, silicon nitride and other ceramic materials.) The slurry is dispensed to the wafer surface 104, for instance, into pits, trenches or grooves 108 in the silicon wafer 102. For example, this dispensing can be by a treating method using a capillary dispensing tube, described in U.S. Provisional Patent Application 61/204,382, and Patent Cooperation Treaty Patent Application PCT/US2010/020245, incorporated by reference, herein, above. The vehicle (such as water) evaporates, leaving behind the particles 110 of the dried slurry, which is packed in multiple layers 112a, 112b, etc.

Figure 1B:
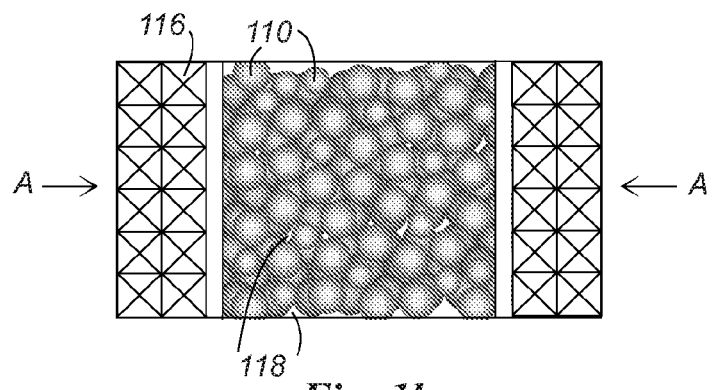
FIG. 1b shows a schematic plan view of the semiconductor surface shown in FIG. 1a, with the groove filled with porous material.
Figure 1B:
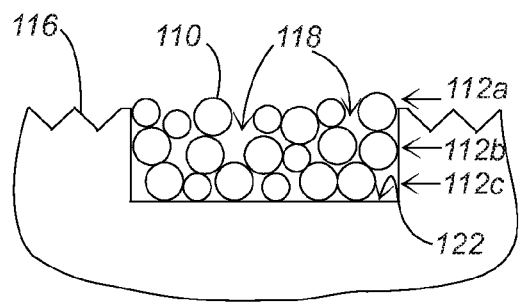
Figure 1C:
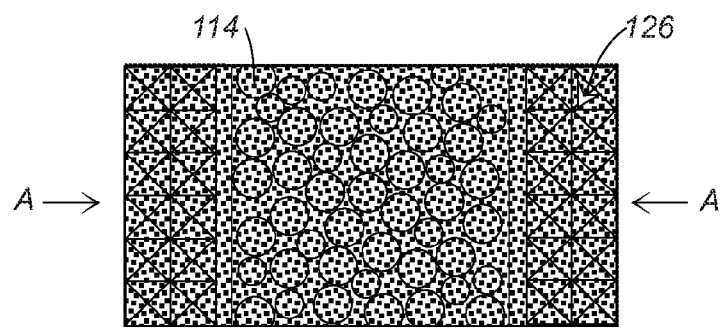
FIG. 1c shows a schematic plan view of the semiconductor surface shown in FIG. 1b, with the groove filled with porous material and a coating film deposited over the entire surface.
Figure 1C:
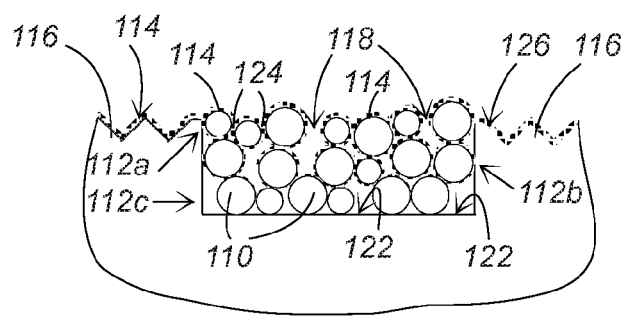
Figure 1D:
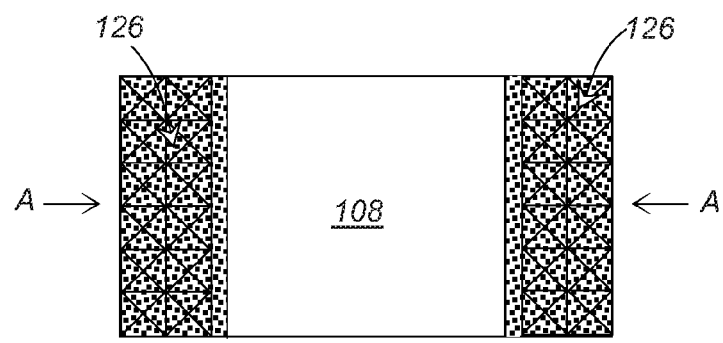
FIG. 1d shows a schematic plan view of the semiconductor surface shown in FIG. 1c, with the porous material and coating film removed from the groove, but with the coating remaining over the non-groove portions of the surface.
Figure 1D:
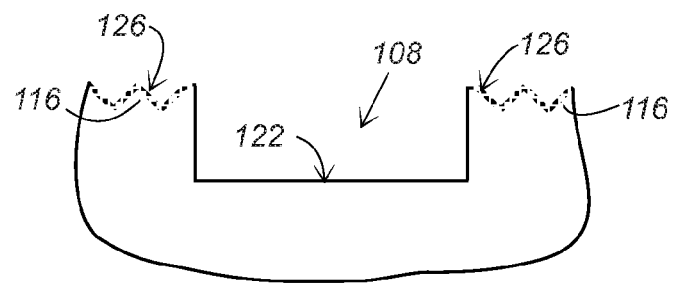

Next, the wafer 102 with dried slurry, as shown in FIGS. 1b and 1bA can be put in a machine that deposits a layer 114 of silicon nitride, for example, by Plasma Enhanced Chemical Vapor Deposition (PECVD) or reactive sputtering. The silicon nitride deposition is done at a low pressure so that it is very nearly line of sight. In this way, porous powder stacked in layers can shield the desired surface regions 122 of the silicon 104 from deposition of the film 114, because all lines of sight from the film deposition source to the surface regions 122 are blocked by one or more powder particles 110. Most of the deposition takes place on the very top layer 112a of powder 110, with decreasing amounts of deposition extending to the layers 112b, 112c below and ultimately none to the surface 122 of the silicon in the protected region.

The film 114 deposited as an antireflection coating is approximately 0.08 microns thick and as such it cannot close the pores 118 in the powder layer 110, which are much larger in size (typically wider and also deeper). By size of a pore, it is meant a diameter of a substantially spherical pore, and, for a non-spherical, elongated pore, the dimension of the pore that is substantially parallel to the surface. However, some amount of the film will deposit at the necks 124 between powder particles 110, thereby joining them together. Note that not all the necks between powder particles, even in the topmost layer 112a will be joined by the film, because some of these necks will be shielded from line of sight deposition.

The film and the PLOL under it can be removed by various methods, discussed below.

The wafer 102 can be immersed in a liquid that etches the deposited film 114. For example, immersion in a solution of 5% HF in water will be sufficient to cause the film 114 and particles 110 of the PLOL to fall away in about 10 seconds, with only very mild agitation. During this time, the coherent film 126 deposited on the portions 116 of the substrate not covered by PLOL 110 will etch only very slightly—perhaps 5% of the film thickness at most. The film 114 above the PLOL 110 falls away quickly because only the necks 124 between a few of the powder particles 110 have to weaken to cause it to come off and the etchant is able to attack from all directions and both surfaces of the film coating, because it penetrates through the pores 118 left open in the film-coated PLOL.

As an alternative removal method for some embodiments, it is possible to remove the film 114 by washing with ultrasonic action only—with no chemical etchant present, but typically with a non-reactive liquid, such as water or alcohol, being present. The vibrations that are transmitted to the particles break the necks holding them together.

As a third alternative, a combination of simultaneous chemical etching and ultrasonic action can be used to remove the film at the regions covered by the particles of the PLOL.

As a fourth alternative, the force imparted by a spray of liquid may be sufficient to loosen and remove both the PLOL particles and the overlying film.

As a fifth alternative, the physical action of brushes moving across the surface may sufficient to loosen, and with aid of liquid, remove both the PLOL particles and the overlying film.

It is also possible to use a dry etch method to remove the PLOL particles.

Figure 1E:
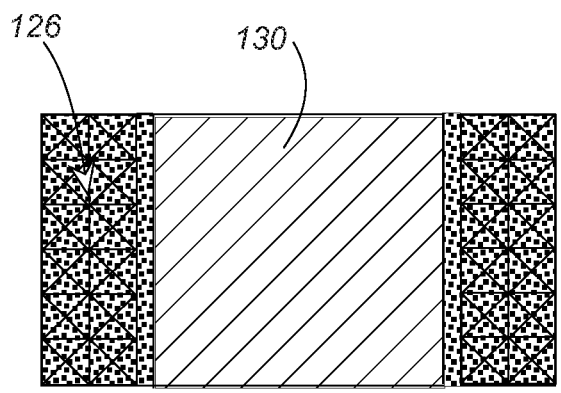
FIG. 1e shows a schematic plan view of the semiconductor surface shown in FIG. 1d, with metallization provided in the groove.
Figure 1E:
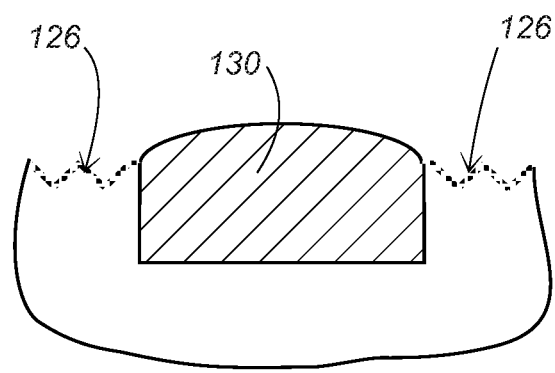

Following film removal, as shown schematically with FIGS. 1e and 1eA, the cell may be metalized using techniques such as electroless nickel deposition or metalorganic deposition, to provide a metal conductor 130 within the groove 108.

While some deposition processes, such as evaporation, sputtering and PECVD are close to line of sight in nature, others, such as thermal chemical vapor deposition (TCVD) are not, and do not require a line of sight from an external coating environment to the surface for a successful coating. However, if there are enough layers of powder particles, even such non line of sight processes will not be able to deposit material on the regions desired to be masked by PLOL, because the reactants will be depleted before they can reach the masked surface.

Figure 6:
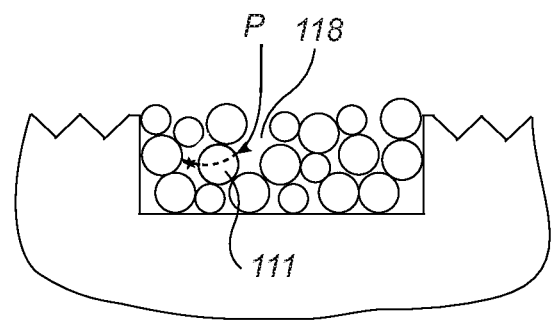
FIG. 6 shows the same situation shown in FIG. 1b, illustrating how liquid can flow laterally within a porous layer.

It is important to note that the porous material should preferably have pores that would permit flow of material, not only from top to bottom (such as from outside of the groove 108, past layer 112a, then to layer 112b and 112c), substantially perpendicular to the surface to be treated, but also, laterally, within any of these layers (substantially parallel to the surface), such as is shown schematically with reference to FIG. 6. FIG. 6 shows, a path of open porosity from outside, through a surface pore 118, and then through another pore, which is behind the particle (as indicated by the dotted pathway P). Such porosity permits the flow of etching agent throughout the volume of porous particles, so that it can attack the deposited film layer 114 at locations that are not adjacent a pore 118. Such porosities in the lateral dimensions also work in the same manner as discussed above, to prevent the deposited film layer 116, for instance of anti-reflective material, from closing off flow of etchant in the lateral dimensions, because the porosities are larger than the thickness of the deposited layer.

For non-line of sight techniques, it is also important that the pore size in the dimension substantially parallel the surface be larger than the thickness of the film being deposited so that openings in the film remain in all directions, permitting the flow of removal chemistry all the way to the surface, thus enabling removal of all of the film at the locations where it is not desired. It is not believed that the pore size in the dimension substantially perpendicular to the surface needs to be this large, because as the filming material traverses the solid material along that dimension, it will attach thereto and become depleted.

For methods in which removal of the PLOL is entirely, or largely by mechanical means, such as ultrasonic or mechanical vibration, and in which removal chemistry is not as important, it is important that the film not form a continuous layer of sufficient strength to prevent the mechanical action from dislodging the particles.

Figure 2:
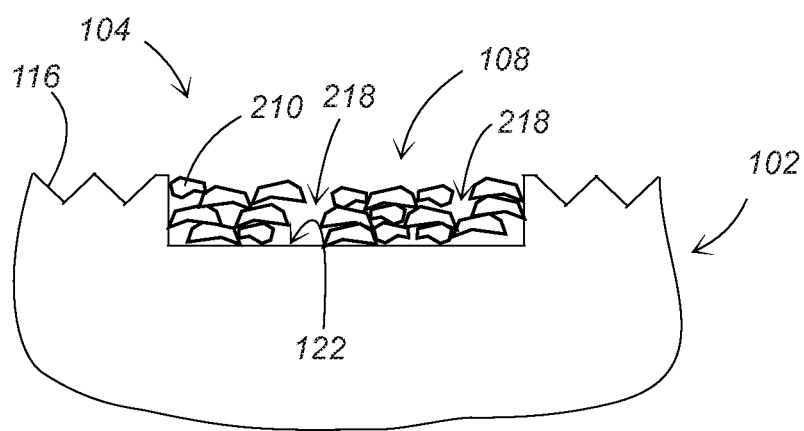
FIG. 2 shows, schematically in cross sectional view, a porous layer composed of non-spherical particles.

While the example cites the use of spherical particles, other shapes are also possible and may hold advantages, as PLOL material for different deposition processes. For example, as shown schematically in FIG. 2, a more platelet-like shape particle 210 may further reduce the number of necks formed in a line of sight deposition process, by more effective shadowing of the deeper layers from the external source of deposition material. Other items not specifically discussed, identified with reference numerals 2xy, are analogous to items with reference numerals 1xy, shown in FIGS. 1a-1e and 1aA-1eA. Equiaxed shaped particles have also been found to be useful.

Metal powders can also be used for some applications, including powders of iron, nickel, silver, copper, cobalt, molybdenum and tungsten and alloys of these metals. Metal powders have the advantage that etchants can be found which will attack the powder, but not attack the deposited film. For example, if silicon nitride film is deposited on a porous lift-off layer made of copper or nickel powder, ferric chloride can be used to etch the powder without attacking the film outside of regions where it is on top of the porous lift-off layer. Once the underlying powder has been removed, much of the film deposited on it will fall away in segments. The remainder can be removed with ultrasonic agitation, or with the aid of a fluid or gas jet.

Ceramic and metal powders have the advantage that they can tolerate moderate and high temperatures during the deposition of the film. This temperature tolerance adds particular value to this method of patterning. For example, the silicon nitride films used in silicon-wafer solar cells are commonly deposited at a temperature between 350 and 500 C. In cases where films can be deposited at low temperatures, polymeric powders can be used, including powders of PMMA, polystyrene, and acetyl. Polymeric powders may be removed by dissolution in a solvent. Alternatively, they may be removed by heating the sample and causing the polymer to burn out. As described above for metal powder, the remaining film can then be removed The PLOL material may be applied by various methods, including those known in the arts, including screen printing, pad printing, ink-jet printing, stencil printing, flexographic printing, gravure printing and atomization, including the so called Aerosol Jet methods used by Optomec Corp., of Albuquerque, N. Mex., for fine line atomized deposition.

Figure 7A:
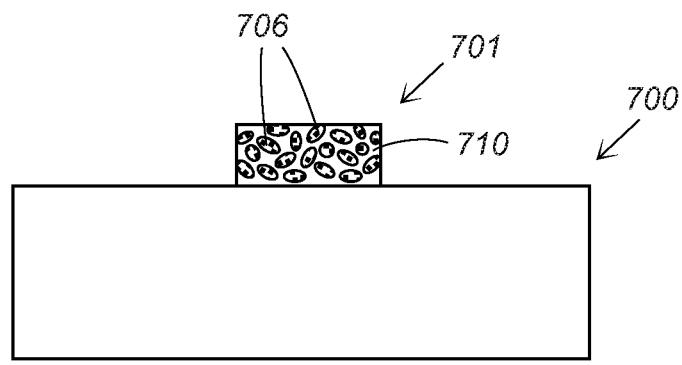
FIG. 7a shows, schematically, a layer containing particles and a fugitive material applied to the top of a silicon wafer, with the size of the fugitive material layer being exaggerated for illustration purposes.
Figure 7B:
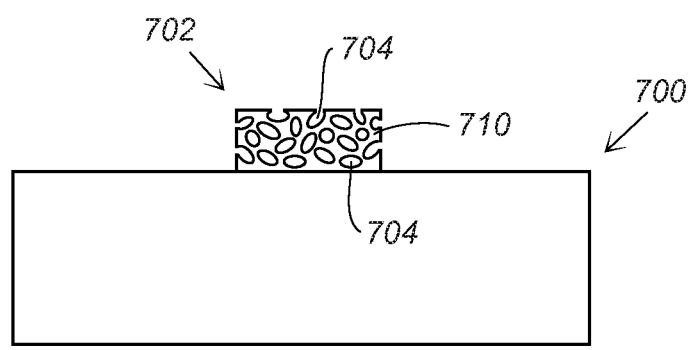
FIG. 7b shows, schematically, the layer of FIG. 7a, after removal of the fugitive material leaves pores.

The PLOL can be created by the application of a material that, upon firing, becomes porous. For example, a spin-on glass, with particles of fugitive polymer (which burns out to leave porosity) can be applied. If a high volume fraction of polymer powder is used, a lacey structure will result after the vehicle of the spin-on glass evaporates and the polymer is burned out. FIGS. 7a and 7b show such a structure, schematically. As shown schematically with reference to FIG. 7b a body 702 has interpenetrating networks of solid material 710 and pores 704. Such a structure will etch out very rapidly. Such a structure can be provided with an initial structure, as shown schematically by FIG. 7a. A body 701 containing silica 710 and a fugitive material 706 is applied to the top of a silicon wafer 700. After burnout of the fugitive material 706, pores 704 are left in place of the fugitive material 706, as shown in FIG. 7b. The pores 704 are interconnected by passageways perpendicular to the plane of drawing. The film is then deposited over the body 702, which performs in a similar manner as would the particles 310a of porous lift off layers described below and shown in FIG. 3a. The fugitive material can be in the form of particles, or can result from phase separation during cool-down of an applied layer. Other methods of depositing layers with interconnected porosity as known in the art may be used as well.

Figure 3A:
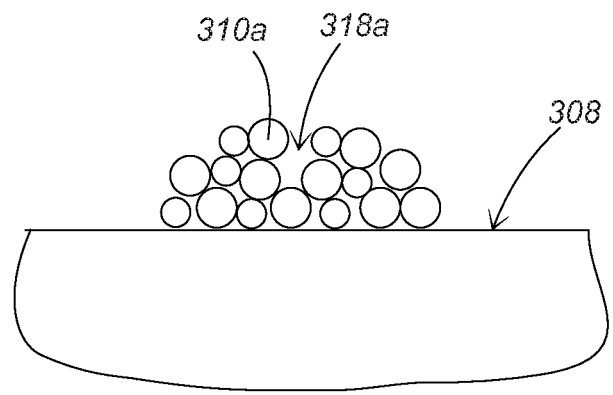
FIG. 3a shows, schematically in a cross-sectional view, a porous layer of spherical particles upon a flat surface.
Figure 3B:
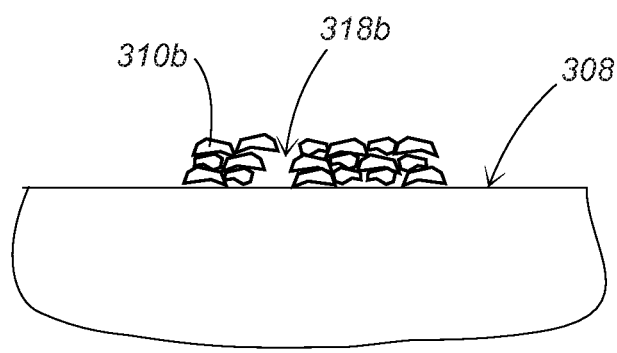
FIG. 3b shows, schematically in a cross-sectional view, a porous layer of non-spherical particles upon a flat surface.

The foregoing discussion has used an example with the PLOL deposited within a depression 108 of the surface, such as a pit, a groove or a trench. As shown in FIGS. 3a and 3b, particles of a PLOL, either spherical 310a, or non-spherical 310b, may be deposited on a flat surface 308. Pores 318a or 318b will remain, through which etchant can pass to remove any coating provided upon the upper layers of the particles.

Figure 4:
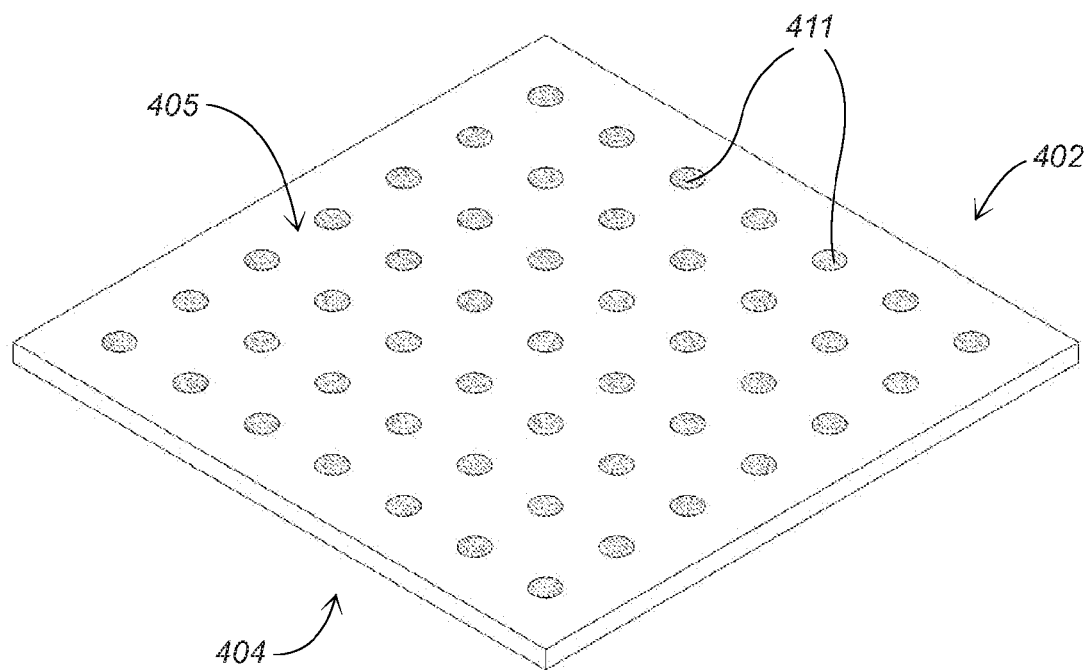
FIG. 4 shows, schematically a back surface contact with regions bearing particles arranged in spaced apart dots.

Methods disclosed herein may be applied, as shown with reference to FIG. 4 to the back surface 405 structure of a solar cell 402 as well as to the front, sun-facing contact 404 (not shown directly). For example, a PLOL layer may be deposited in small dots on a regular grid such as a hexagonal or square array. The dots are composed of deposited particles, as described above. They may be in depressions, or upon a flat surface. The dots might be approximately 50-70 microns in diameter and have a spacing of 500-800 microns, for example. The dielectric film would then be deposited and then selectively removed in the spots where PLOL is present. Such a patterning process might cause less damage to the underlying silicon than might other methods such as laser ablation or chemical etching. An aluminum layer can then be deposited either by evaporation, sputtering or by screen printing aluminum paste. The metal will make contact to the silicon through the holes opened in the film. In the case of the aluminum paste and with proper firing as known in the art, a p+ structure will be formed at the contact spots, further aiding in minimizing losses at the back of the cell.

Figure 4A:
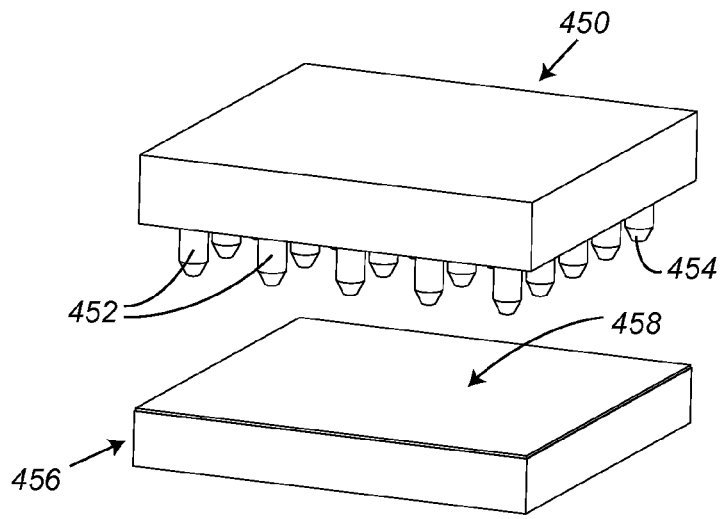
FIGS. 4a-4e show, schematically, an apparatus for transferring slurry that contains particles from a supply to a surface, such as shown in FIG. 4, at sequential stages of a transfer process.
Figure 4B:
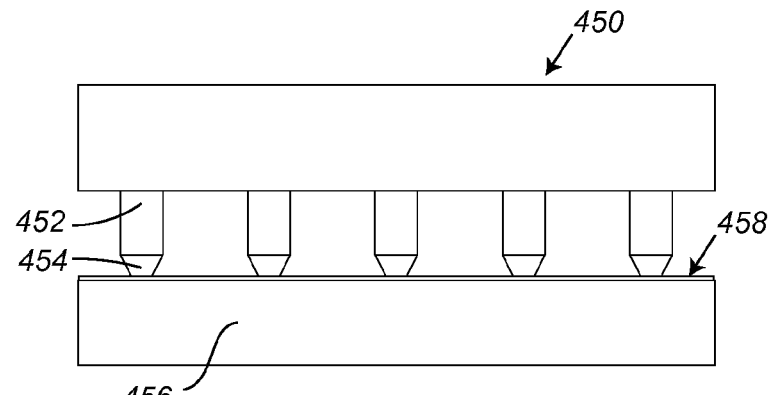
Figure 4C:
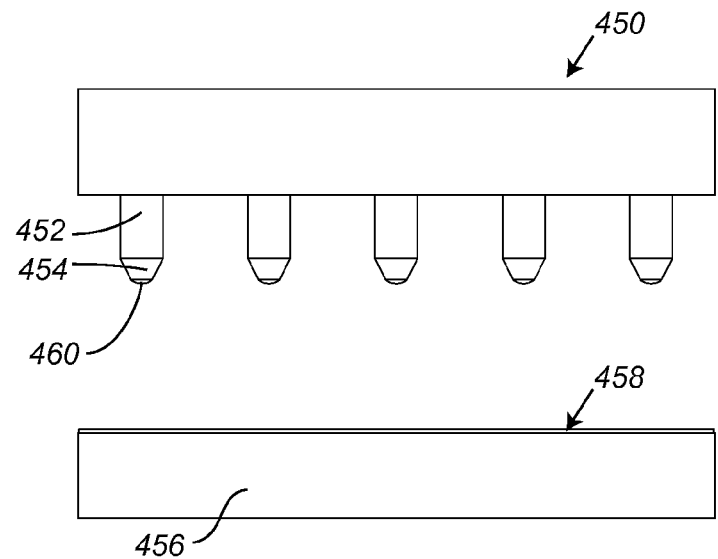

FIG. 4a shows, schematically, an apparatus for providing porous material in a slurry. A fixture 450 carries a plurality of transfer elements 452, in this case roughly cylindrical bodies with a tapered tip 454, which may be a frustrum of a cone. A body 456 retains a volume of slurry material 458, which is a liquid vehicle that contains solid particles, as discussed. The slurry is the thin layer 458 on the top of the body 456. (The body 456 can be a concave vessel, a porous pad, such as an inking pad, or even a flat surface upon which the slurry is retained by surface tension and viscosity.) The slurry can be doctor bladed, spun, sprayed or otherwise coated onto 456, or provided to the body 456 by any appropriate means. The thickness of the layer 458 of slurry can be in the range of 1-15 microns, but typically can be 2-5 microns. As shown in FIG. 4b, the fixture is brought toward the slurry, such that the tips 454 of the transfer elements contact the slurry 458. The tips are fabricated from a material to which the slurry attaches after the fixture is moved away from the slurry, as shown in FIG. 4c, such that droplets, or small volumes of slurry material are retained on the transfer elements. Care must be taken to select the viscosity of the slurry, the relative contact angle of the slurry and the material of the transfer element tips, so that sufficient slurry is retained to provide an adequate transfer, and also so that it does not drip or otherwise slop during transfer. The slurry should also wet the wafer 404 better than it does the tips 454 of the transfer elements 452. A suitable material for the transfer elements 452 is silicone rubber as this allows for molding the entirety of the fixture 450 and the transfer elements 452 in one shot.

Figure 4D:
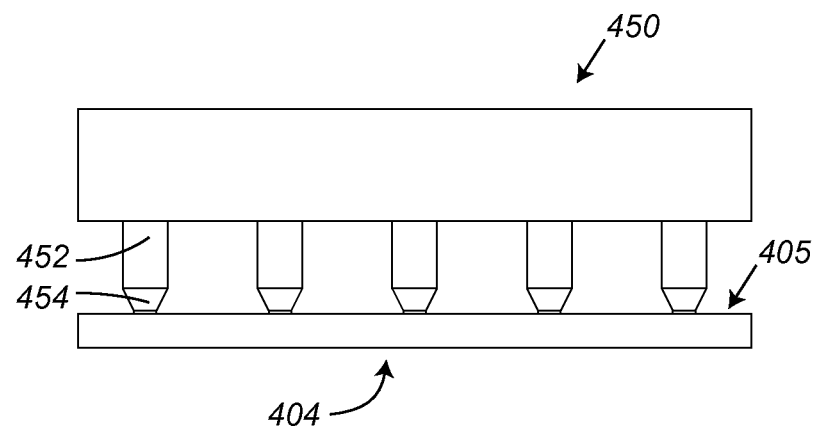
Figure 4E:
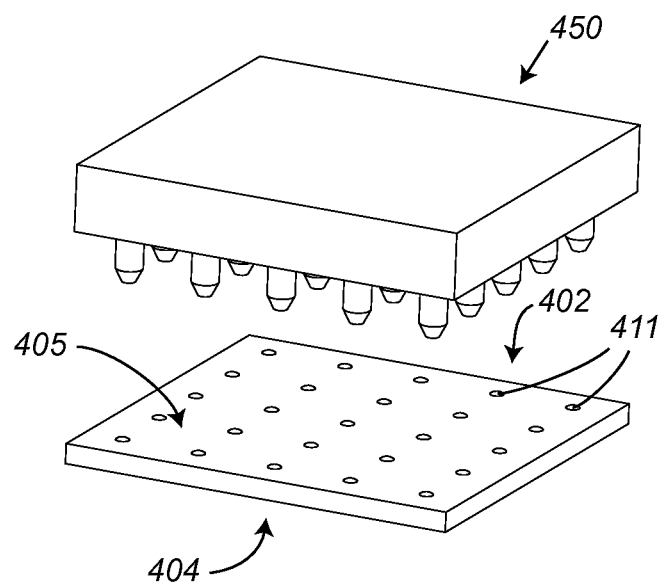

As shown in FIG. 4d, the fixture 450 and transfer elements 452 are brought to bear upon a back surface 405 of a solar cell 402 (as shown in FIG. 4) so that the retained slurry droplets 460 contact the back surface 405 of the solar cell 402. The fixture 450 and transfer elements 452 are then withdrawn, as shown in FIG. 4e, and the droplets 460 have been left upon the surface 405, forming dots 411 of slurry, as described above. The slurry is then dried, to leave a porous material at the locations of the dots, and processed as described above. The slurry and the material of the back surface 405 must also be designed with a viscosity and relative contact angle, etc., so that a sufficient quantity of the slurry is transferred from the transfer elements 452 to the surface 405.

The shape of the dots 411 may be governed to some degree by the shape of the tips 454 of the transfer elements 452. For instance, circular cross-section shaped tips will leave circular dots. Rectangular cross-section shaped tips with one side significantly longer then the other would leave a similarly shaped dot. The congruence of the shape of the dot relative to the shape of the transfer element tip will also depend upon the viscosity of the material and the relative contact angles between the slurry material and the transfer elements 452, on the one hand, and the back surface 405, on the other hand. It will also depend upon the volume of material retained thereon, which may depend on the thickness of the slurry layer 458.

The masking property of PLOL material can also be used to mask dry etching steps. One example is the partial etchback of a diffused emitter to form a selective emitter structure, such as described in PCT Application PCT/US2009/02422, mentioned above. Another example is full etchback of diffused regions to form point or line contact regions on an interdigitated back contact structure.

The selective emitter application is particularly useful, because a single application of the PLOL layer can serve two functions. One is allowing highly doped regions to remain at a higher doping degree below the PLOL layer, while the degree of doping in other areas are etched away for lighter doping and better blue responses. The second function is also allowing for opening up the SiN film above the PLOL layer. It is desired that the same region be both more highly doped, and also film free. The porous material shields this region from agents that reduce the doping level and also facilitates removal of any film that covers the porous material. A possible processing scheme as it applies to structures disclosed in the selective emitter application just mentioned and also the SAC patent application No. PCT/US2008/002058, mentioned above, self aligned cell structure, is shown schematically with reference to FIGS. 5a-5g.

Figure 5A:
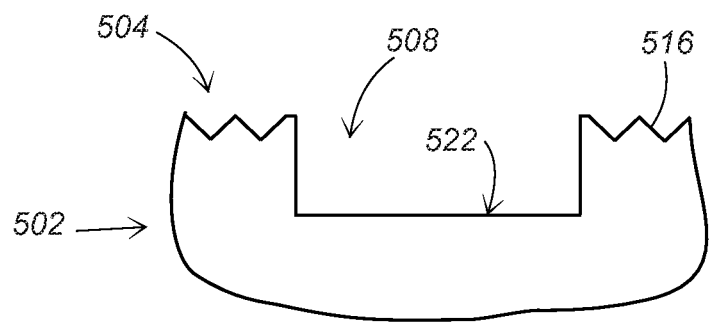
FIGS. 5a-5g show, schematically, in cross-sectional view, stages of a process in which a wafer is provided with a selective diffusion (some regions of higher doping degree), also using a porous layer of particles to remove a film coating from undesired regions.
Figure 5B:
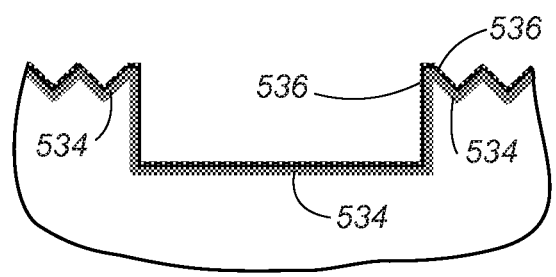
Figure 5C:
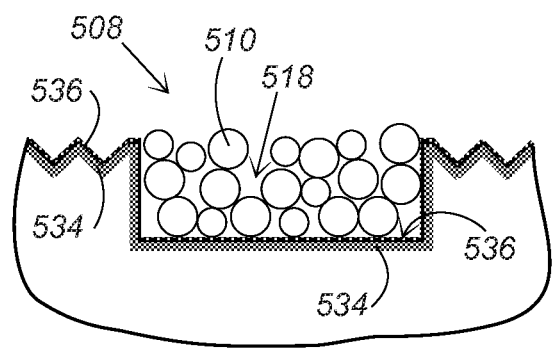
Figure 5D:
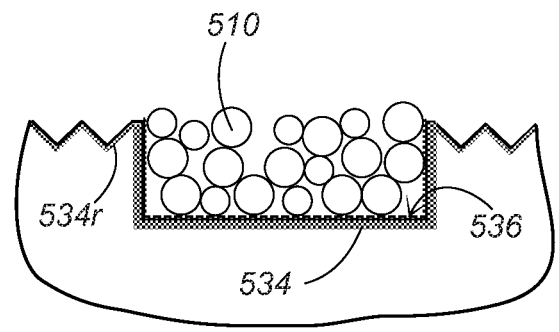

Texture, such as a groove 508 and light trapping pit regions 516 are provided to a surface 504 of a wafer 502. Eventually, metallization will contact the wafer 502 at the bottom 522 of the groove 508. As shown with reference to FIG. 5b, the entire wafer is highly doped at approximately 20 to approximately 40 ohms/sq everywhere, resulting in a highly doped layer 534 and a dopant glass layer 536 everywhere, including the grooves and non-groove regions. As shown with reference to FIG. 5c, PLOL particles 510 are provided in the metallization grooves 508. The PLOL is dried, if it has been provided by a liquid vehicle, leaving pores 518 between the particles. The wafer is then placed in a vacuum system, and the dopant P-glass 536 in areas not masked by PLOL (for instance the light trapping regions 516, is etched with $CF_4/H_2$, thus exposing the highly doped silicon underneath 534r, as shown in FIG. 5d, such that it becomes less highly doped. Note that within the groove 508, the highly doped layer 534 has not been reduced in thickness, while, in the absorber region 516, it has been reduced in thickness 534r. Then Si is etched with SF, to increase the sheet rho to between approximately 60 and approximately 150 ohms/sq in the regions 516, outside the areas covered with PLOL particles 510 as shown in FIG. 5d.

Figure 5E:
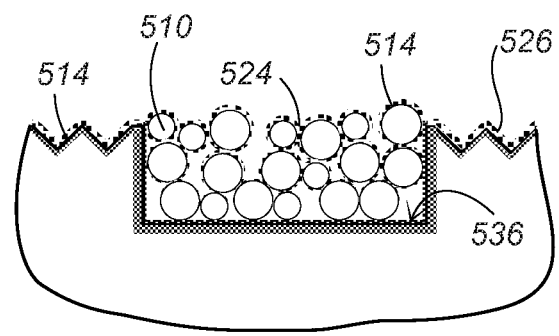
Figure 5F:
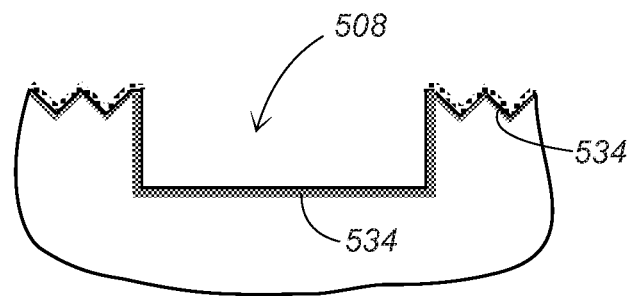
Figure 5G:
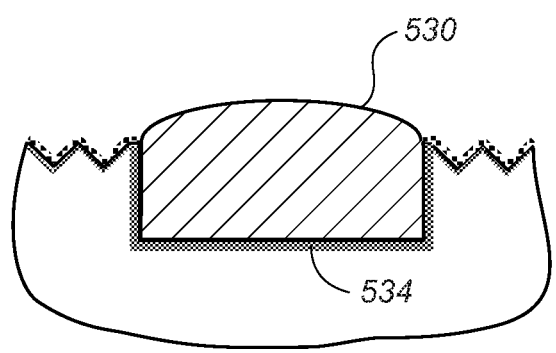

Then, as shown in FIG. 5e, SiN (which can, for example, function as an anti-reflection agent in a finished photovoltaic device) is deposited, everywhere, including over the PLOL layer in grooves, resulting in a film 514 upon the particles 510, and also a film 526 in the light absorbing regions 516, where it is desired to minimize light reflection. The body is then placed into an in-line or batch etch system where it can be subjected to an ultrasonic or sprayed HF etch to remove PLOL material 510 and also to remove dopant P-glass 536 in the grooves 508, resulting in the condition shown at FIG. 5f. (For the case where any significant SiN 514 also is etched away during this step, akin to the 5% mentioned above for a different example, the SiN thickness 514 could be compensated by depositing it at an increased thickness). The wafer is then rinsed, dried, and finally, a metallization 530 is provided in the groove 508, with underlying highly doped layer 534.

While the above embodiments of the PLOL process describe applications involving the patterning of dielectric layers and diffusion layers in silicon-wafer based solar cells, inventions disclosed herein are more general and include the patterning of dielectrics and diffusion layers on silicon thin-film solar cells, of dielectrics and diffusion layers on non-silicon thin-film solar cells. Furthermore, the patterning of materials other than dielectrics is also possible. Applications within the solar cell industry include the patterning of metal conductor layers, transparent conductor layers, semiconductor contact layers, semiconductor surface passivation layers, semiconductor heterojunction layers, and semiconductor homojunction layers.

One example of the application of PLOL for patterning metal layers is in the formation of back interdigitated metallization on back contacted silicon-wafer solar cells. One method of forming such a structure involves the complicated use of etch masking material and etchback of evaporated or sputtered metal seed layer stacks prior to plating up of the patterned metal. This seed layer patterning could be more simply performed by depositing PLOL on the surface where the metal is not desired, then depositing the seed layer stack, for example 400 nm of (Aluminum/Titanium-Tungsten/Copper) Al/TiW/Cu, then removing the PLOL and overlying metal, for example by immersion in a ultrasonic bath.

Inventions disclosed herein can be used to pattern a variety of films, including but not limited to dielectrics including but not limited to: silicon nitride, silicon oxide, silicon carbide and alloys of these preceding three; phosphorous-containing silicon oxide, boron-containing silicon oxide, and aluminum oxide.

Inventions disclosed herein can also be used to pattern a variety of transparent conductor films, including but not limited to: zinc oxide, tin oxide and indium tin oxide.

Inventions disclosed herein can be used to pattern a variety of metal films, including but not limited to: silver, aluminum, nickel, titanium, tungsten, titanium tungsten alloys, molybdenum, chromium, tin, alloys of tin and silver and copper; copper, indium, gallium, selenium, and alloys/mixtures of these preceding four.

Inventions disclosed herein can be used to pattern semiconductor films, such as: silicon, doped silicon, gallium arsenide; amorphous silicon, amorphous germanium, amorphous carbon and doped versions of these preceding three and alloys and doped alloys of these preceding three; copper indium diselenide, copper indium, copper indium gallium diselenide, cadmium sulfide, zinc sulfide, and cadmium telluride.

Inventions disclosed herein can also be used to pattern films upon thin film or wafer substrates of some of the foregoing semiconductors.

Inventions disclosed herein can be used with films that have been deposited by a variety of methods, including atmospheric chemical vapor deposition, low pressure chemical vapor deposition, plasma enhanced chemical vapor deposition, atomic layer deposition, sputtering, sublimation and evaporation, as well as others mentioned above.

While particular embodiments have been shown and described, it will be understood by those skilled in the art that various changes and modifications may be made without departing from the disclosure in its broader aspects. It is intended that all matter contained in the above description and shown in the accompanying drawings shall be interpreted as illustrative and not in a limiting sense.

SUMMARY

For semiconductor wafer processing, a porous lift off layer is used to facilitate removal of certain other applied materials, such as antireflection film coatings. A porous layer, composed of particles and porosities that are larger than the applied film layer, is provided in a region where no coating is desired. After the film has been applied over the porous layer and also other parts of the semiconductor where it is desired, the porous material is removed, which also results in removal of the overlying film that is not intended for those areas. The porous layer can be provided as a slurry, which is later dried to open up porosities, or a layer having fugitive particles within a field of some material, such as a heat degradable or liquid soluble particles, which disassociates from the field upon the application of heat or solvent. The film layer can be removed by etching away, by providing an etchant, which enters the film layer through porosities that have arisen due to the film not bridging the spaces between particles. The etchant flows throughout the porous layer, attacking the film from both of its surfaces. Particles may have diameters of, for instance, four to ten times the film thickness. Particles may be silica, alumina and other ceramics. Such porous layers can be used in depressions into which metallization is to be provided, to protect the depression from antireflective coating.

An important aspect of an invention hereof is a method for providing a film to only certain regions of a surface. The method comprises: providing a surface; providing porous material at a location of the surface where film is not desired; providing film upon the surface, including both the location where the porous material has been provided and another location, where film is desired, the film having a thickness no greater than the size of pores of the porous material; and removing the porous material from the surface, and removing any film that has been deposited upon the porous material that is removed. Regions of the surface where the porous material had been provided are substantially free of the film, and other regions are provided with the film.

For related embodiments, the step of removing may comprise a chemical step, such as etching, a mechanical step, such as vibration, or a combination of mechanical and chemical steps.

With an important class of embodiments, the step of providing a film comprises providing a film having pores therethrough, i.e., an imperfect film, at the location where the porous material has been provided.

With many, embodiments, the step of providing the porous material comprises providing sufficient layers of porous material such that substantially no line of sight exists from an external coating environment to any part of the surface at the location where the porous material has been provided.

In general, the step of removing the porous material comprises rupturing the film at the location where the porous material has been provided.

Different embodiments of method inventions hereof make use of particles of different shapes. They may be substantially spherical, substantially equiaxed, or platelet-like, or a combination thereof. Rather than individual particles, the porous material may comprise a substantially interconnected solid network interpenetrated with a network of pores.

For one useful embodiment, the step of providing porous material comprises providing a slurry that contains particles and subsequently causing any liquid of the slurry to depart from the slurry.

For another useful embodiment, the step of providing porous material comprises providing dry particles.

The surface may comprise a flat surface or a textured surface with depressed regions and raised regions, in which case, porous material is typically deposited in the depressed regions.

According to yet another embodiment, the step of providing porous material may comprise providing fugitive particles within a field of material, further comprising the step of removing the fugitive particles to open up porosities in the field material. A suitable fugitive particle may comprise a polymer.

The particles that form the porous material may be metal, including but not limited to: iron, nickel, silver, copper, cobalt, molybdenum and tungsten and alloys of these metals, or ceramic, including but not limited to: silica, alumina, silicon nitride and silicon carbide.

Other embodiments may use different methods to deposit film, including but not limited to: atmospheric chemical vapor deposition, low pressure chemical vapor deposition, plasma enhanced chemical vapor deposition, atomic layer deposition (ALD), sublimation, sputtering and evaporation.

An important embodiment is one in which the deposited film is a silicon nitride film, such as is used for anti-reflection purposes in photovoltaic applications.

Yet another important aspect of method embodiments of inventions hereof is that the porous material have porosities in a lateral dimension substantially parallel to the surface, which are larger in size than the film thickness.

For still another embodiment the step of providing the porous material comprises a method selected from the group consisting of: screen printing, pad printing, ink-jet printing, stencil printing, flexographic printing, gravure printing and atomization.

With a related embodiment, the step of providing the porous material comprises depositing a liquid that contains porous material through a flexible tube.

For embodiments that provide particles in a liquid vehicle, the step of providing the porous material may comprise contacting a transfer element to a slurry, which adheres temporarily to the transfer element, and then contacting the slurry to the surface, whereby the slurry transfers from the transfer element to the surface.

Another aspect of inventions hereof is a method for forming a patterned layer of relatively higher doping on a semiconductor wafer. The method comprises: providing a wafer with a doped layer on one surface; providing porous material to a location of the surface; dry etching any dopant-oxide film that covers regions of the doped layer not covered by the porous material; dry etching a portion of the doped layer not covered by the porous material, reducing its thickness; providing a dielectric film upon the surface, including both the location where the porous material has been provided and another location, the film having a thickness no greater than the size of pores of the porous material; removing the porous material from the surface, and removing any film that has been deposited upon the porous material that is removed; and removing any remaining dopant-oxide that may remain in the areas that had been masked by the porous material. Thus, the result is regions that are more highly doped than others, which regions are also not covered by a film.

Many techniques and mechanical aspects of the inventions have been described herein. The person skilled in the art will understand that many of these techniques and mechanical aspects can be used with other disclosed techniques, even if they have not been specifically described in use together. Any combinations, sub-combinations, sub-sub-combinations, etc., of elements disclosed herein which can be effectively combined and used, are intended to be set forth as explicit inventions, whether claimed or not claimed. It would be impossible to specifically set forth as an invention the many hundreds of viable combinations that are inventive, and that are based on inventions disclosed herein.

Thus, inventions disclosed herein include methods, articles of manufacture, and manufacturing apparatus.

Method inventions disclosed herein include methods of applying a film to selective regions of a surface, while leaving other regions of the surface film free. The surface may be a semiconductor surface, or another material. If a semiconductor, the surface may be more highly doped in the regions that remain film free, than in other regions. Other arrangements are also possible. For methods that involve selective doping and that do not, the porous material may be particles, such as spherical, equiaxed, or platelet-like, or it may be an interconnected network of solid material, interpenetrated by a network of porosity. Other steps to accomplish other functions may be interspersed with the steps of providing the porous material, providing the film, and then removing the porous material and any film overlaying it. Any step that suitably removes the porous layer and overlaying film is within the contemplation of the inventors hereof, whether chemical etching, mechanical, or other dry or liquid process.

For instance, any suitable method for providing the porous material may be used. Any suitable method for providing the film layer may be used. Any suitable method for removing the porous layer, and with it, the film layer, may be used. Any of these suitable methods of providing porous material, providing film layer, removing porous layer and film layer, may be used with any suitable method for achieving the other functions. Furthermore, any of such methods may also be used in connection with methods that provide a highly doped region, and then mask portions of that region with the porous material, and subsequently reduce the degree of doping in unmasked regions. And, likewise, any suitable method for providing the more highly doped region, and also for reducing the degree of doping in the unmasked regions, may be used with any of the methods for providing the porous material, providing the film material, and removing the porous material, and the film material.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

What is claimed is:

1. A method for providing a film to only certain regions of a photovoltaic device surface, the method comprising:
   a. providing a surface;
   b. providing porous material at a location of the surface where film is not desired;
   c. providing film upon the surface, including both the location where the porous material has been provided and another location, where film is desired, the film having a thickness no greater than a size of pores of the porous material; and d. removing the porous material from the surface, and removing any film that has been deposited upon the porous material that is removed;

whereby regions of the photovoltaic device surface where the porous material had been provided are substantially free of the film, and other regions are provided with the film.

2. The method of claim 1, removing comprising a chemical step.

3. The method of claim 2, removing comprising etching.

4. The method of claim 1, removing comprising a mechanical step.

5. The method of claim 2, removing also comprising a mechanical step.

6. The method of claim 4, removing comprising vibration.

7. The method of claim 1, providing a film comprising providing a film having pores therethrough at the location where the porous material has been provided.

8. The method of claim 1, providing the porous material comprising providing sufficient layers of porous material such that substantially no line of sight exists from an external coating environment to any part of the surface at the location where the porous material has been provided.

9. The method of claim 1, removing the porous material comprising rupturing the film at the location where the porous material has been provided.

10. The method of claim 1, the porous material comprising substantially platelet-like particles.

11. The method of claim 1, the porous material comprising substantially spherical particles.

12. The method of claim 1, the porous material comprising substantially equiaxed particles.

13. The method of claim 1, the porous material comprising a substantially interconnected solid network interpenetrated with a network of pores.

14. The method of claim 1, providing porous material comprising providing a slurry that contains particles and subsequently causing any liquid of the slurry to depart from the slurry.

15. The method of claim 1, providing porous material comprising providing dry particles.

16. The method of claim 1, the surface comprising a substantially flat surface.

17. The method of claim 1, the surface having a depression, the step of providing porous material comprising providing the porous material in the depression.

18. The method of claim 1, the step of providing porous material comprising providing fugitive particles within a field of material, further comprising the step of removing the fugitive particles to open up porosities in the field material.

19. The method of claim 18, the fugitive field comprising a polymer.

20. The method of claim 1, the porous material comprising ceramic particles.

21. The method of claim 14, the porous material comprising particles selected from the group consisting of: silica, alumina, silicon nitride and silicon carbide.

22. The method of claim 1, the porous material comprising metal particles.

23. The method of claim 22, the porous materials comprising particles selected from the group consisting of: iron, nickel, silver, copper, cobalt, molybdenum and tungsten and alloys of these metals.

24. The method of claim 1, the film selected from the group consisting of: films deposited by: atmospheric chemical vapor deposition, low pressure chemical vapor deposition, plasma enhanced chemical vapor deposition, atomic layer deposition, sputtering, sublimation and evaporation.

25. The method of claim 1, the film being selected from the group consisting of: silicon nitride, silicon oxide, silicon carbide and alloys of these preceding three; phosphorous-containing silicon oxide, boron-containing silicon oxide, and aluminum oxide.

26. The method of claim 1, the film being selected from the group consisting of: zinc oxide, tin oxide and indium tin oxide.

27. The method of claim 1, the film being selected from the group consisting of: dielectrics, metals, and semiconductors.

28. The method of claim 1, the film being selected from the group consisting of: silver, aluminum, nickel, titanium, tungsten, titanium tungsten alloys, molybdenum, chromium, tin, alloys of tin and silver and copper; copper, indium, gallium, selenium, and alloys/mixtures of these preceding four.

29. The method of claim 1, the film being selected from the group consisting of: silicon, doped silicon, gallium arsenide; amorphous silicon, amorphous germanium, amorphous carbon and doped versions of these preceding three and alloys and doped alloys of these preceding three; copper indium diselenide, copper indium, copper indium gallium diselenide, cadmium sulfide, zinc sulfide, and cadmium telluride.

30. The method of claim 1, the surface being selected from the group consisting of: silicon wafers, silicon thin films, compound semiconductors, metals, glass, plastics and dielectrics.

31. The method of claim 1, the porous material having porosities having a size in the lateral dimension substantially parallel to the surface, which size is larger than the film thickness.

32. The method of claim 1, providing the porous material comprising a method selected from the group consisting of: screen printing, pad printing, ink-jet printing, stencil printing, flexographic printing, gravure printing and atomization.

33. The method of claim 1, providing the porous material comprising depositing a liquid that contains porous material through a flexible tube.

34. The method of claim 1, providing the porous material comprising contacting a transfer element to a slurry, which adheres temporarily to the transfer element, and then contacting the slurry to the surface, whereby the slurry transfers from the transfer element to the surface.

35. A method for forming a patterned layer of relatively higher doping on a semiconductor wafer, the method comprising:
   a. providing a wafer with a doped layer on one surface;
   b. providing porous material to a location of the surface;
   c. dry etching any dopant-oxide film that covers regions of the doped layer not covered by the porous material;
   d. dry etching and reducing the thickness of the doped layer not covered by the porous material;
   e. providing a dielectric film upon the surface, including both the location where the porous material has been provided and another location, the film having a thickness no greater than the size of pores of the porous material;
   f. removing the porous material from the surface, and removing any film that has been deposited upon the porous material that is removed; and
   g. removing any remaining dopant-oxide that may remain in the locations to which the porous material had been provided.

* * * * *